United States Patent
Yin

(10) Patent No.: US 10,930,678 B2
(45) Date of Patent: Feb. 23, 2021

(54) CURVED ARRAY SUBSTRATE AND METHOD OF MANUFACTURING THEREOF

(71) Applicant: Wuhan China Star Optoelectronics Technology Co., Ltd., Wuhan (CN)

(72) Inventor: Bingkun Yin, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 6 days.

(21) Appl. No.: 16/326,204

(22) PCT Filed: Nov. 1, 2018

(86) PCT No.: PCT/CN2018/113350
§ 371 (c)(1),
(2) Date: Feb. 17, 2019

(87) PCT Pub. No.: WO2020/062423
PCT Pub. Date: Apr. 2, 2020

(65) Prior Publication Data
US 2020/0176484 A1    Jun. 4, 2020

(30) Foreign Application Priority Data

Sep. 30, 2018  (CN) .......................... 2018 1 1156181

(51) Int. Cl.
*H01L 27/12*    (2006.01)
*H01L 21/768*   (2006.01)
*H01L 21/02*    (2006.01)
*H01L 21/285*   (2006.01)

(52) U.S. Cl.
CPC .... *H01L 27/1218* (2013.01); *H01L 21/76802* (2013.01); *H01L 21/76877* (2013.01); *H01L 27/124* (2013.01); *H01L 27/1259* (2013.01); *H01L 21/0217* (2013.01);
(Continued)

(58) Field of Classification Search
CPC ........... H01L 27/1218; H01L 21/76802; H01L 27/1259; H01L 21/76877; H01L 27/124; H01L 21/02271; H01L 21/0217; H01L 21/02164; H01L 21/2855; H01L 21/0262;
(Continued)

(56) References Cited

U.S. PATENT DOCUMENTS

2017/0170206 A1*  6/2017  Lee .................... H01L 51/52
2018/0076236 A1   3/2018  Kwon et al.
(Continued)

FOREIGN PATENT DOCUMENTS

CN    106206613    12/2016
CN    107799538    3/2018

OTHER PUBLICATIONS

Chuanli et al. (CN 107799538), (hereinafter, Chuanli), with the machine translation (Year: 2018).*

*Primary Examiner* — Yasser A Abdelaziez

(57) ABSTRACT

A curved array substrate includes a substrate, a first metal layer disposed on the substrate, an insulating layer disposed on the substrate and covering the first metal layer, a semiconductor layer disposed on the insulating layer and a second metal layer disposed on the insulating layer and connected to the semiconductor layer, and a via hole is defined in the insulating layer near a bending center thereof, and the second metal layer is connected to the first metal layer through the via hole.

5 Claims, 6 Drawing Sheets

(52) U.S. Cl.
   CPC .... *H01L 21/0262* (2013.01); *H01L 21/02164* (2013.01); *H01L 21/02271* (2013.01); *H01L 21/2855* (2013.01)

(58) Field of Classification Search
   CPC ............... H01L 27/127; H01L 27/1248; H01L 27/1262; H01L 27/1244; H01L 27/1222
   See application file for complete search history.

(56) References Cited

U.S. PATENT DOCUMENTS

2018/0315809 A1* 11/2018 Kim ................... H01L 27/1218
2019/0244983 A1    8/2019 Yuan et al.

* cited by examiner

CURVED ARRAY SUBSTRATE AND METHOD OF MANUFACTURING THEREOF

RELATED APPLICATIONS

This application is a National Phase of PCT Patent Application No. PCT/CN2018/113350 having International filing date of Nov. 1, 2018, which claims the benefit of priority of Chinese Patent Application No. 201811156181.1 filed on Sep. 30, 2018. The contents of the above applications are all incorporated by reference as if fully set forth herein in their entirety.

FIELD AND BACKGROUND OF THE INVENTION

The present invention relates to a field of display, and more particularly to a field of flexible array substrate and a method of manufacturing thereof.

Compared to flat displays, curved displays have a wider viewing angle, which can reduce close-range viewing distortion, and it can make products be differentiated. However, the stress on film layer increases when a display screen is bent, thereby causing a film layer to break, which affects display.

SUMMARY OF THE INVENTION

The stress on film layer is increased when the display screen is bent, thereby causes the film layer to be broken, which affects the display effect. The present invention provides solutions to solve the problems.

A curved array substrate includes a substrate, a first metal layer disposed on the substrate, an insulating layer disposed on the substrate and covering the first metal layer, the insulating layer includes one of silicon nitride and silicon oxide, a semiconductor layer disposed on the insulating layer, and a second metal layer disposed on the insulating layer and connected to the semiconductor layer, and a via hole is defined in the insulating layer near a bending center thereof, and the second metal layer is connected to the first metal layer through the via hole.

Preferably, at least one channel is defined in the second metal layer, and both ends of at least one channel extend toward edges of the second metal layer to penetrate through the second metal layer.

Preferably, the at least one channel is located at the bending center.

Preferably, the at least one channel penetrates through upper and lower sides of the second metal layer.

Preferably, the semiconductor layer is disposed at a side of the at least one channel.

A curved array substrate includes a substrate, a first metal layer disposed on the substrate, an insulating layer disposed on the substrate and covering the first metal layer, a semiconductor layer disposed on the insulating layer and a second metal layer disposed on the insulating layer and connected to the semiconductor layer. A via hole is defined in the insulating layer near a bending center thereof, and the second metal layer is connected to the first metal layer through the via hole.

Preferably, at least one channel is defined in the second metal layer, and both ends of the at least one channel extend toward edges of the second metal layer to penetrate through the second metal layer.

Preferably, the at least one channel is located at the bending center.

Preferably, the at least one channel penetrates through upper and lower sides of the second metal layer.

Preferably, the semiconductor layer is disposed at a side of the at least one channel.

A method of manufacturing a curved array substrate includes S10 forming a first metal layer on a substrate, S20 forming an insulating layer covering the first metal layer on the substrate, S30 forming a patterned semiconductor layer on the insulating layer, S40 defining a via hole in the insulating layer near bending center thereof by etching, S50 forming a second metal layer filling the via hole on the insulating layer, wherein the second metal layer is connected to the first metal layer and S60 patterning the second metal layer to form a source and a drain that are connected to the semiconductor layer.

Preferably, the method of manufacturing a curved array substrate further includes S70 defining at least one channel in the second metal layer, and both ends of the at least one channel extend toward edges of the second metal layer to penetrate through the second metal layer.

Preferably, the at least one channel is located at the bending center.

Preferably, the channel penetrates through upper and lower sides of the second metal layer.

Preferably, the semiconductor layer is disposed at a side of the at least one channel.

The present invention having a beneficial effect is described as follows. At least one channel is defined in the second metal layer near bending center thereof and it can reduce the distance between the apex of the second metal layer along the direction of the curved centerline and the neutral plane, and thus the stress at the apex the second metal layer is reduced. The second metal layer is connected to the first metal layer through via hole, and the connection strength of the second metal layer to the insulating layer is enhanced so as to prevent the second metal layer from being broken.

BRIEF DESCRIPTION OF THE SEVERAL VIEWS OF THE DRAWINGS

In order to more clearly illustrate embodiments or technical solutions in the present invention, the drawings used in the description of the embodiments or current technology will be briefly described below. Obviously, the drawings in the following description are merely some embodiments of the present invention. A person skilled in the art may also obtain other drawings without any creative efforts.

Figure 1:
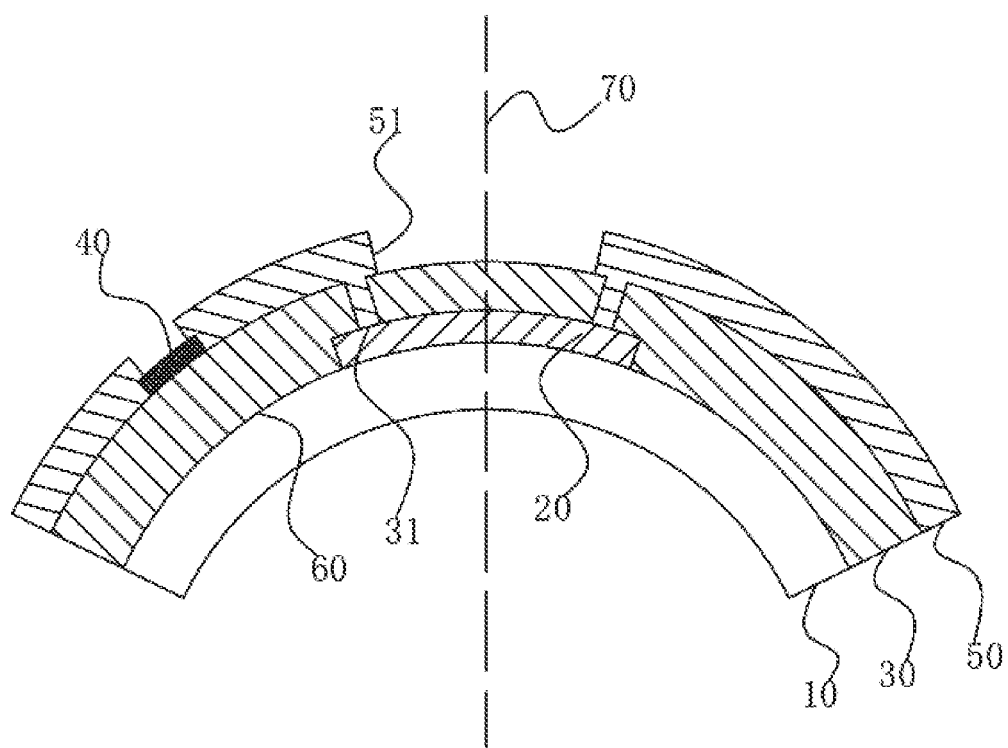
FIG. 1 is a schematic view of a curved array substrate structure according to one embodiment of the present invention.

REFERENCE MARKS substrate 10; first metal layer 20; insulating layer 30; via hole 31; semiconductor layer 40; second metal layer 50; channel 51; source 52; drain 53; neutral plane 60; curved centerline 70.

DESCRIPTION OF SPECIFIC EMBODIMENTS OF THE INVENTION

The following description of the embodiments is provided by reference to the following drawings. Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof. In the figures, elements with similar structure are indicated by the same reference numerals.

The invention is related to the existing curved display panel, and the stress on film layer is increased when the curved display screen is bent, thereby it causes the film layer to be broken, which affects the display effect. Therefore, the above problems can be solved by the present invention.

A curved array substrate is shown in FIG. 1, the curved array substrate includes a substrate 10, a first metal layer 20 disposed on the substrate 10, an insulating layer 30 disposed on the substrate 10 and covering the first metal layer 20, a semiconductor layer 40 disposed on the insulating layer 30 and a second metal layer 50 disposed on the insulating layer 30 and connected to the semiconductor layer 40. A via hole 31 is defined in the insulating layer 30 near a bending center thereof, and the second metal layer 50 is connected to the first metal layer 20 through the via hole 31.

The second metal layer 50 is connected to the first metal layer 20 through the via hole 31, so that the connection strength between the second metal layer 50 and the insulating layer 30 is increased. Also, the stress resistance of the second metal layer 50 is increased so as to prevent the second metal layer 50 from being broken.

At least one channel 51 is defined in the second metal layer 50, and both ends of at least one channel 51 extend toward edges of the second metal layer 50 to penetrate through the second metal layer 50. The semiconductor layer 40 is disposed at a side of the at least one channel 51.

It should be noted that at least one channel 51 is one channel or a plurality of channels. In one embodiment, the number of the channels 51 can be choose according to actual needs. Generally, if the thickness of the curved array substrate is larger, more channels 51 are needed. Specifically, the at least one channel 51 is located at the bending center.

As shown in FIG. 1, it can be understood that the stress at any point is related to the radius of curvature and the distance from the point to the neutral plane 60 when curved array substrate is bent. The larger distance, the greater stress at the point. Thus, when the curved array substrate is bent, the stress at the apex of the curved surface along the direction of curved centerline 70 is the largest. The neutral plane 60 is a region where no stress is applied when the curved array substrate is bent. In this embodiment, the neutral plane 60 is a junction between the substrate 10 and the first metal layer 20.

Specifically, the at least one channel 51 penetrates through upper and lower sides of the second metal layer.

In one embodiment, at least one channel 51 is disposed at the bending center, and it can reduce the distance between the apex of the second metal layer 50 along the direction of the curved centerline 70 and the neutral plane 60, and thus the stress at the apex the second metal layer 50 is reduced so as to prevent the second metal layer 50 from being broken.

Figure 2:
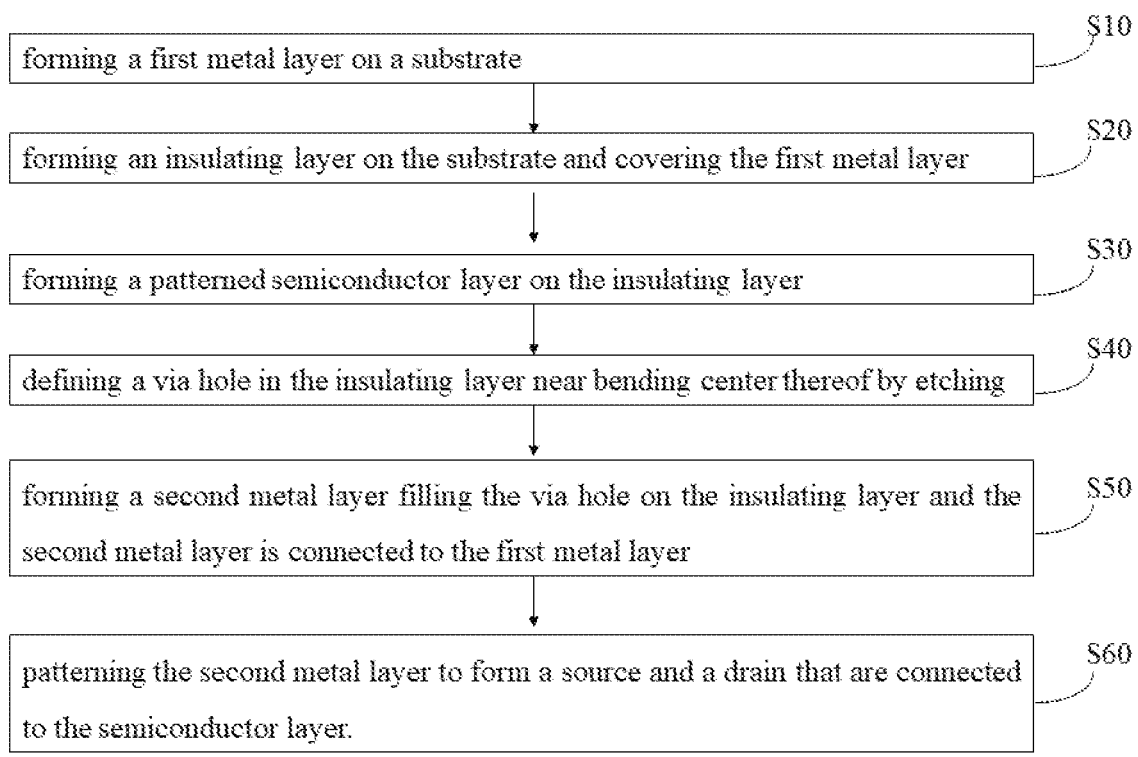
FIG. 2 is flow chart diagram of a method of manufacturing the curved array substrate according to one embodiment of the present invention.

As shown in FIG. 2, the present invention also provides a method for manufacturing a curved array substrate, and the method for manufacturing the curved array substrate includes the steps as follows:

S10 forming a first metal layer 20 on a substrate 10;
S20 forming an insulating layer 30 covering the first metal layer 20 on the substrate 10;
S30 forming a patterned semiconductor layer 40 on the insulating layer 30;

S40 defining a via hole 31 in the insulating layer 30 near bending center thereof;

S50 forming a second metal layer 50 filling the via hole 31 on the insulating layer 30, and the second metal layer 50 is connected to the first metal layer 20; and S60 patterning the second metal layer 50 to form a source 52 and a drain 53 that are connected to the semiconductor layer 40.

The second metal layer 50 is connected to the first metal layer 20 through the via hole 31, so that the stress resistance of the second metal layer 50 is increased so as to prevent the second metal layer 50 from being broken.

Specifically, the detailed manufacturing processes of the curved array substrate are shown in FIG. 3 to FIG. 6.

Figure 3:
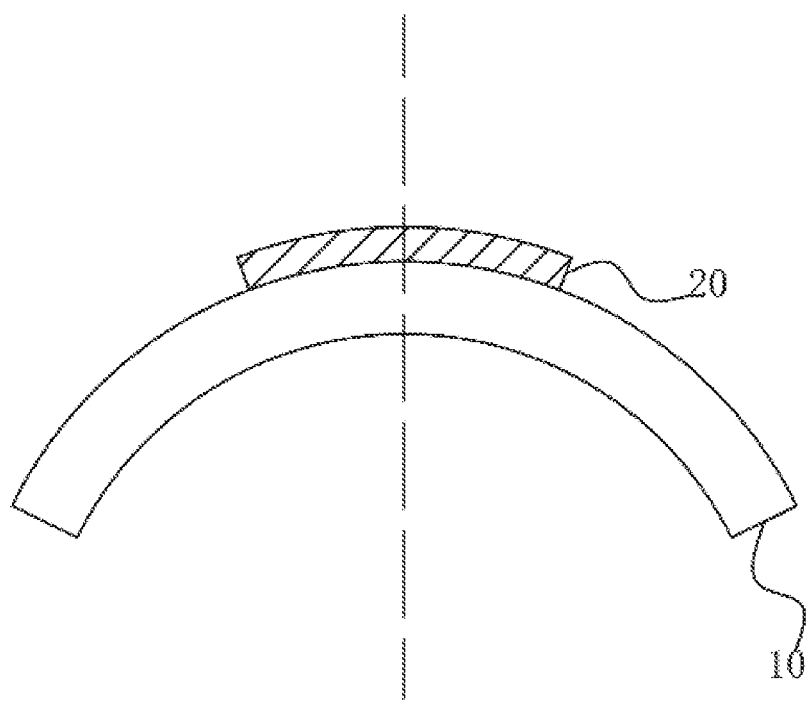
FIGS. 3, 4, 5 and 6 are schematic views of the curved array substrate according to one embodiment of the present invention.

As shown in FIG. 3, the first metal layer 20 is deposited by physical vapor deposition, and the first metal layer pattern is formed by exposure, development and etching. It should be noted that the first metal layer 20 can be deposited by other methods such as chemical vapor deposition.

Figure 4:
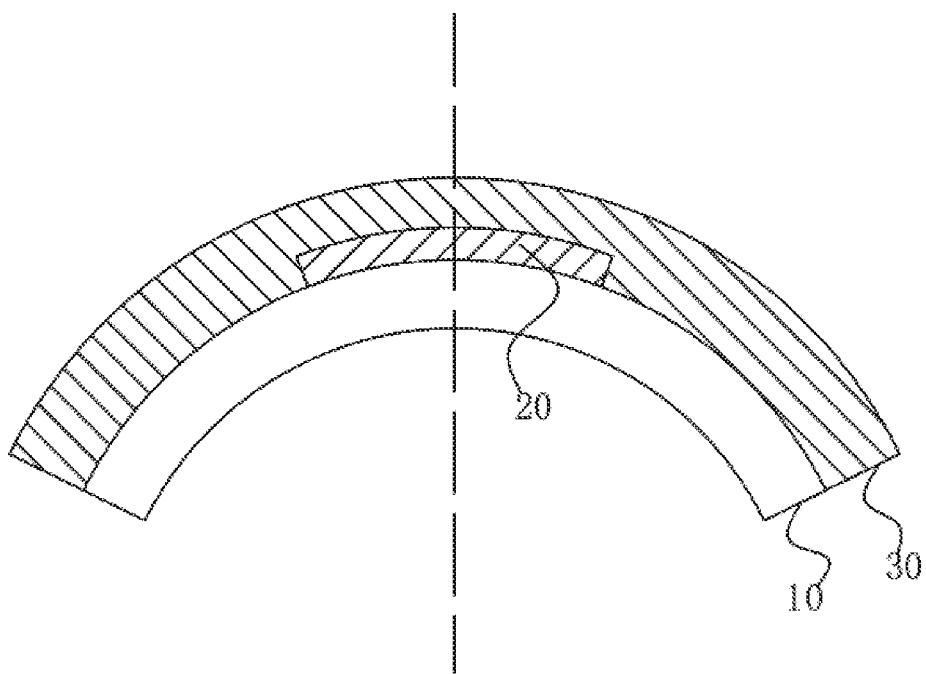

As shown in FIG. 4, the insulating layer 30 is formed by a chemical vapor deposition, and the insulating layer 30 includes one of silicon nitride and silicon oxide.

Figure 5:
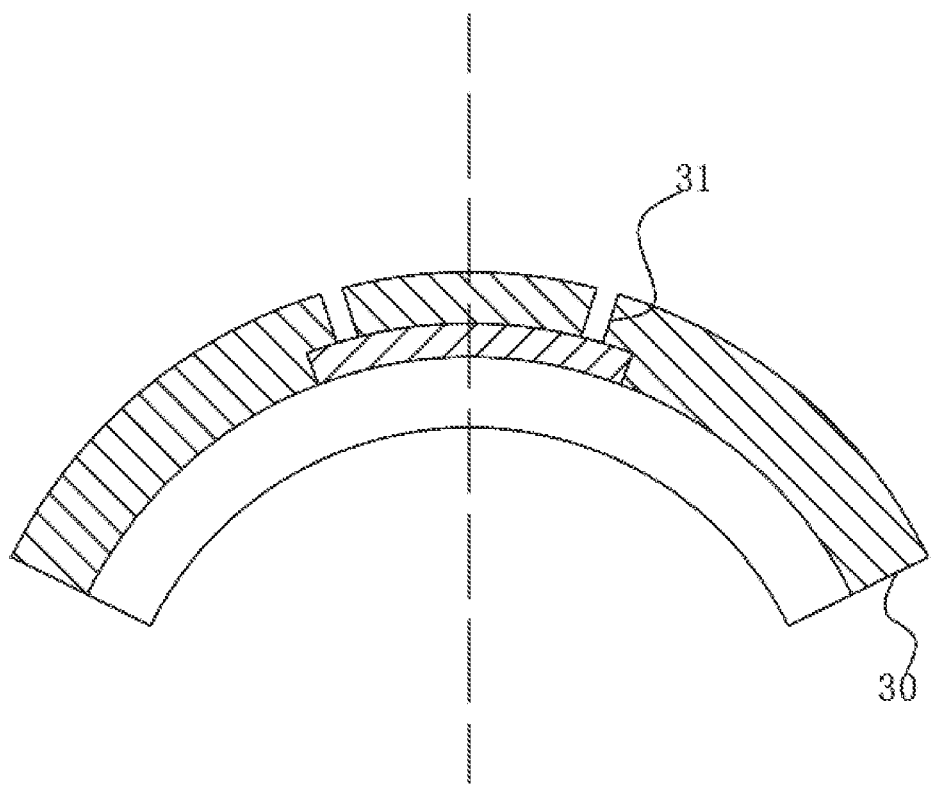

As shown in FIG. 5, a via hole 31 is defined in the insulating layer 30 near bending center thereof.

Figure 6:
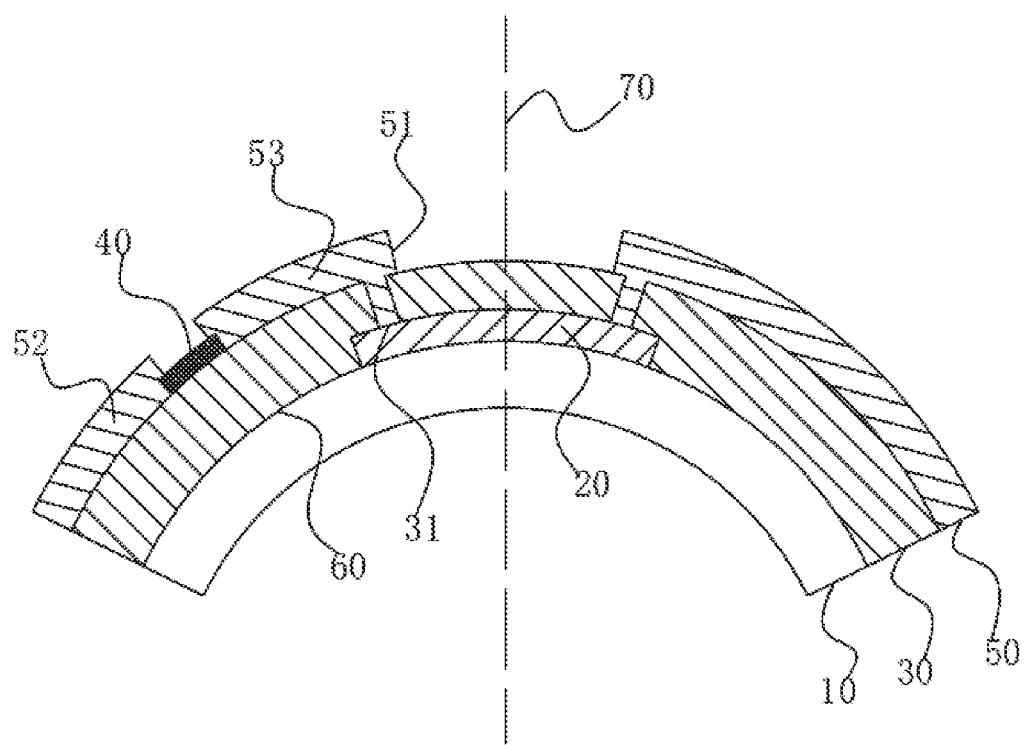

As shown in FIG. 6, the semiconductor layer 40 is formed on the insulating layer 30 by chemical vapor deposition, and the semiconductor layer 40 is patterned so as to form a patterned semiconductor layer 40. The second metal layer 50 is formed on the insulating layer 30 by physical vapor deposition, and the second metal layer 50 is connected to the first metal layer 20 through the via hole 31. Patterning the second metal layer 50 to form a source 52 and a drain 53 that are connected to the semiconductor layer 40.

The method for manufacturing a curved array substrate further includes defining at least one channel 51 in the second metal layer 50, and both ends of the at least one channel 51 extend toward edges of the second metal layer 50 to penetrate through the second metal layer 50.

Specifically, the at least one channel 51 is located at the bending center

Specifically, the channel 51 penetrates through upper and lower sides of the second metal layer 50.

The at least one channel 51 is disposed at the bending center, and it can reduce the distance between the apex of the second metal layer 50 along the direction of the curved centerline 70 and the neutral plane 60, and thus the stress at the apex the second metal layer 50 is reduced so as to prevent the second metal layer 50 from being broken.

The present invention having a beneficial effect is described as follows. At least one channel 51 is defined in the second metal layer 50 near bending center thereof and it can reduce the distance between the apex of the second metal layer 50 along the direction of the curved centerline 70 and the neutral plane 60, and thus the stress at the apex the second metal layer 50 is reduced. The second metal layer 50 is connected to the first metal layer 20 through via hole 31, and the connection strength of the second metal layer 50 to the insulating layer 20 is enhanced so as to prevent the second metal layer 50 from being broken.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A method of manufacturing a curved array substrate, comprising:
- S10 forming a first metal layer on a substrate;
- S20 forming an insulating layer covering the first metal layer on the substrate;
- S30 forming a patterned semiconductor layer on the insulating layer;
- S40 defining a via hole in the insulating layer near a bending center thereof by etching;
- S50 forming a second metal layer filling the via hole on the insulating layer, wherein the second metal layer is connected to the first metal layer; and
- S60 patterning the second metal layer to form a source and a drain that are connected to the semiconductor layer.

2. The method of manufacturing a curved array substrate of claim 1, wherein the method further comprises:
- S70 defining at least one channel in the second metal layer, and both ends of the at least one channel extend toward edges of the second metal layer to penetrate through the second metal layer.

3. The method of manufacturing a curved array substrate of claim 2, wherein the at least one channel is located at the bending center.

4. The method of manufacturing a curved array substrate of claim 3, wherein the channel penetrates through upper and lower sides of the second metal layer.

5. The method of manufacturing a curved array substrate of claim 4, wherein the semiconductor layer is disposed at a side of the at least one channel.

* * * * *